United States Patent [19]
Sharma

[11] Patent Number: 5,978,574
[45] Date of Patent: Nov. 2, 1999

[54] FORMAL VERIFICATION OF QUEUE FLOW-CONTROL THROUGH MODEL-CHECKING

[75] Inventor: Debendra Das Sharma, Santa Clara, Calif.

[73] Assignee: Hewlett-Packard Company, Palo Alto, Calif.

[21] Appl. No.: 08/964,811

[22] Filed: Nov. 5, 1997

[51] Int. Cl.[6] .................................................... G06F 9/455
[52] U.S. Cl. ............................... 395/500.41; 395/500.35; 395/185.04; 395/183.13
[58] Field of Search .............................. 395/500, 500.23, 395/500.34, 500.03, 500.35, 500.41, 183.13, 184.01, 185.04; 364/578; 710/29

[56] References Cited

U.S. PATENT DOCUMENTS

| | | | |
|---|---|---|---|
| 4,616,359 | 10/1986 | Fontenot | 370/60 |
| 5,590,304 | 12/1996 | Adkisson | 395/427 |
| 5,701,439 | 12/1997 | James et al. | 395/500 |

*Primary Examiner*—Kevin J. Teska
*Assistant Examiner*—Thai Phan

[57] ABSTRACT

The inventive system and method for verifying flow control of a queue on a cycle by cycle basis, involves modeling the queue, checking for an overflow condition and an underflow condition in the model during each cycle, and determining any changes to the number of entries in the queue during the cycle. This mechanism is repeated until each cycle has been verified. The queue is modeled to have a number of entries in the range of −1 to N+1, where N is the maximum number of entries the queue may hold, −1 represents the underflow condition, and N+1 represents the overflow condition. To accurately represent the number of entries in each cycle, the number of entries that the each producer and each consumer is capable of adding to or subtracting from the queue in each cycle is modelled.

36 Claims, 1 Drawing Sheet

FORMAL VERIFICATION OF QUEUE FLOW-CONTROL THROUGH MODEL-CHECKING

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD OF THE INVENTION

This application relates in general to the performance of computer data storage mediums, and in specific to the design verification of a queue by using a model checking tool to verify flow control of the queue.

BACKGROUND OF THE INVENTION

FIG. 1 depicts a typical process 10 in designing and constructing a computer system that uses queues. The first step is the architectural design phase 11, and this is where the developer formulates the specification of the system, and determines which components will be in the system, the number and characteristics of the FIFO queues (first-in, first-out), whether the system will use cache, etc. The specification can be written in a natural language like English or in a pseudo code like C.

In the second step 12, the specification is written in a high level description language (HDL). Here the specification from the design step 11 is written in code language like VERILOG or VHDL. After the code is written, the next step 13 is to perform software simulation or hardware emulation on the system design and HDL implementation. Software simulation is using software to simulate the performance of the system. Hardware emulation is using off-the-shelf hardware components to construct a model of the system. The developer may choose to use either simulation or emulation, or both.

The design of step 11 and the implementation of step 12 are tested, and if bugs are found in step 14, depending upon their origin, then either the design or the implementations will be modified. From the design flow 10, it is apparent that design errors are more serious than implementation errors. Steps 11–14 are iterated until no more bugs are found.

Once no more bugs are found by simulation and/or emulation, then the chip is developed. In step 15 the design is synthesized, and put on tape, and released to the foundry where the chip is produced. Once the chip is produced, the actual chip will be tested via post silicon verification. As compared with to step 13, where the system chip was either simulated via software or emulated via hardware, in step 16 the actual physical chip is tested for bugs. If bugs 18 are present, then the developer will determine whether the bugs can be fixed by a change in a metal layer, or whether the design must be modified in step 11 or the implementation must be changed in step 12. If the change can be made in the metal layer then the change is made in step 15 by sending the chip back to the foundry. However, if the error is more serious, then correction will take place in either step 11 or step 12.

A critical aspect to the design flow 10 is queue flow control. Typical designs will have many queues and FIFOs, rams, stacks, as well as other components. One way of considering FIFO queues is to regard entities placing entries into the queue as a producer, and entities removing entries from the queue as a consumer. The interaction of consumers and producers with the queue can cause two problems. One problem is queue overflow, where producers overload a queue, insert more data than the queue can store and data is lost or overwritten, which is sometimes terms 'dropped on the floor'. The other problem is queue underflow. This condition occurs when consumers pull more data from the queue than the queue is holding, and consequently the consumers receive invalid data.

Queue flow control is traditionally addressed in steps 13 and/or 16, where verification is being performed. The traditional approach to verify queue flow-control has been through simulation, emulation, or post-silicon verification. In large systems, the simulation approach verifies few cases as it becomes very difficult to stress the queues enough to get to the corner cases. This is because the queues are deep in systems, and thus it takes many simulation cycles to get an entry into the queue. Consequently, it is difficult and costly to fill up the queue and verify the corner or worst case situations.

One prior art solution is to reduce the number of queue entries for the simulation. For example, suppose that the queue is designed to store 100 entries, but for the simulation, it will be assumed that the queue only has 10 entries. Thus, it is now possible for the simulation to more easily fill up the queue and test the corner cases. However, this assumption introduces two new problems. First the reduction in size may lead to errors that would not exist if the queue was at 100 entries, i.e. false positives. Second, the reduction in size may hide other errors, and allow bugs to slip through the verification, i.e. false negatives.

Although hardware emulation covers more cases than software simulation, it does not guarantee that all the cases have been verified in the various queues in the system. Since, real off-the-shelf hardware is being used to model the design, then the system is working at a much faster rate than software simulation. Thus, the queues are easier to fill up and the case coverage is going to be better than the software simulation. However, since the system is represented in a piecemeal fashion, it is difficult to isolate the true sources of any errors that may occur, as each error might have multiple sources. Moreover, the piecemeal fashion may introduce errors that would not be present in the actual chip, because of conditions in the emulation that would not be present in the actual chip, e.g. additional wire delay. Furthermore, since this is a representation of the design and not the actual chip, there is still incomplete coverage, and not all of worst cases are tested.

Using post-silicon verification overcomes most of the problems associated with software simulation and hardware emulation, since the actual chip is being tested and not some representation of the design. However, the main problem with verification is that it takes place late in the design flow or cycle, such that errors in the design, implementation, and/or realization may occur after the chip has been shipped to a customer. Thus, making corrections to the design or implementation is extremely costly in terms of customer satisfaction, and time as corrections to the design require the complete traversal of the design flow.

Consequently, there is a need in the art for a method and apparatus for verification of queue flow control that substantially covers the corner or worst case situations, and performs this verification early in the design flow. Although this would not completely eliminate the need for simulation, emulation, and/or verification, as there are some design aspects that must be handled in this fashion. However, by reducing the number of bugs, particularly the queue flow control bugs, early in the design flow results in a superior system design potentially a faster tune to market.

SUMMARY OF THE INVENTION

These and other objects, features and technical advantages are achieved by a system and method in which uses model checking to provide formal verification of the design and also is automated after the model has been written. The inventive model checking tool exhaustively searches the entire state space, and insures that the design is correct and that no overflow or underflow conditions exist. If there is an overflow or underflow condition it provides a counter-example describing how the overflow (or underflow) may occur. The designer can then fix the problem and run the model again. This process iterates until the tool determines that there are no flow-control problems in the system. The inventive tool operates early in the design flow process, during either the design or implementation phases.

The inventive tool follows the producer-consumer approach where producers will put their input into a queue and the consumers will consume from the queue. The inventive tool has a flow-control mechanism where a queue informs its producers not to add any input if the high-water mark is reached, modeling exactly what the hardware does. Different producers may have different delays in receiving this flow-control information and may already have some inputs in flight. The inventive flow-control mechanism may adopt different high-water marks for each producer thus allowing for the individual delays in receiving flow-control information, and the amount of traffic that may be in flight under different conditions, thereby optimizing performance. This inventive feature prevents queue overflow which could imply loss of information, and lead to loss of data (and hence service), data corruption, and some other flow-control problems such as livelock, deadlock, or starvation.

Similarly, the inventive tool has a flow-control mechanism where a queue informs its consumers not to remove any input if the low-water mark is reached. This feature prevents an underflow condition which is the consumption of information that was not produced by any producer. Underflow may lead to data corruption in addition to introducing flow-control problems such as deadlock, livelock, or starvation.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention such as stacks, rams, etc. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
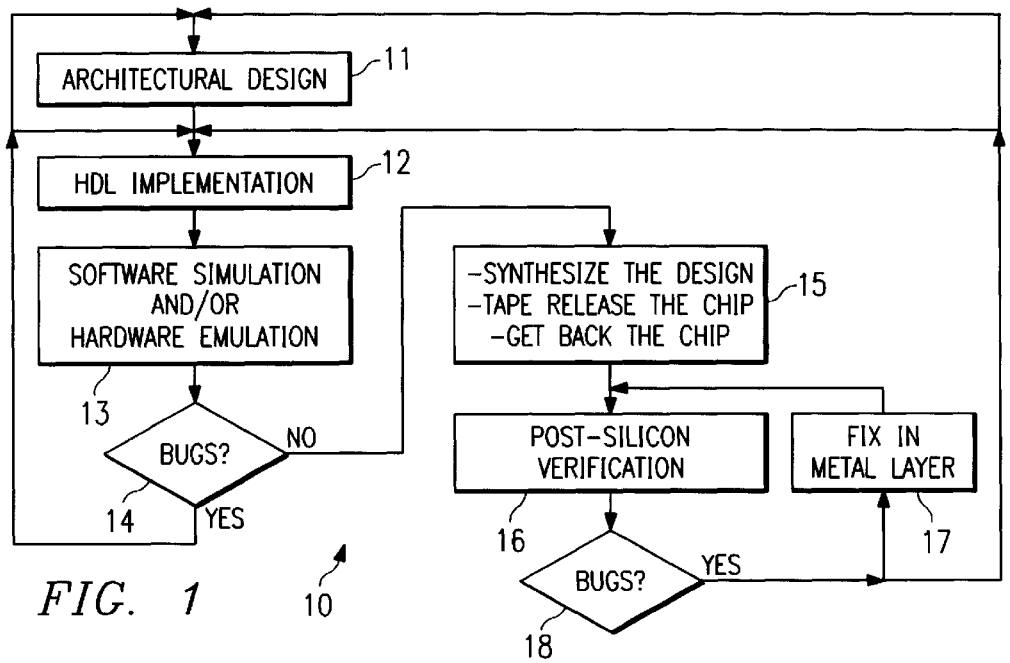
FIG. 1 depicts a typical design flow for a chip.
Figure 2:
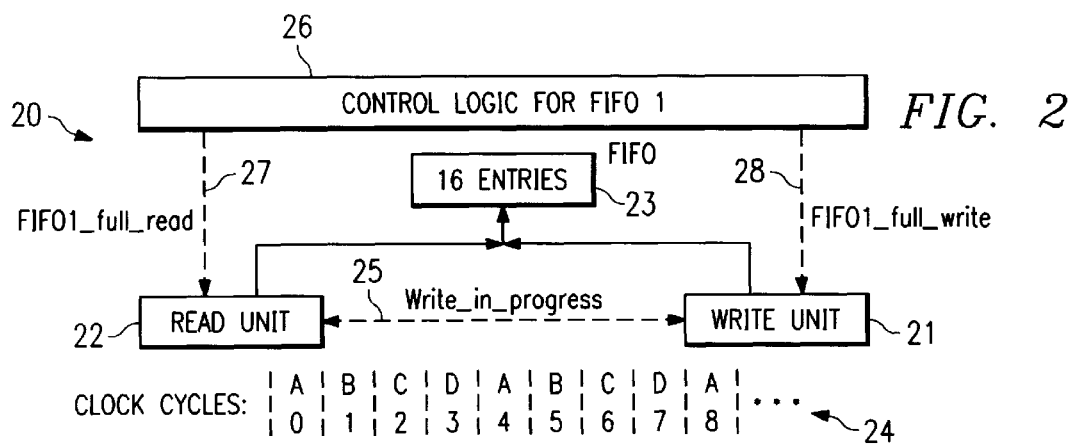
FIG. 2 depicts a FIFO queue with two producers, a read unit and a write unit.

FIG. 2 depicts a simplified version of a FIFO queue with two produces that will be modelled using the inventive flow control tool. The components depicted in FIG. 2 could all be one chip, or each component could be on a different chip. For purposes of discussion, assume that all components are located on the same chip, for example an I/O controller chip 20. FIG. 2 has two producing units, write unit 21 and read unit 22, that place entries into FIFO 23. The chip 20 uses clock 24 for timing purposes. The clock cycle will cycle 0, 1, 2, 3, 4, 5, 6, 7, 8 and so on. Either the read unit or the write unit can put what are known as transactions into the FIFO 23. A transaction could be a read request, a write back of the cache line, or other entities that I/O chip would handle. Note that a single transaction can comprise more than one entry in the FIFO. For example, each transaction from the read unit 22 can be one or two cycles long, in which case they will take one or two entries in the FIFO 23. Specifically, if the transaction is one cycle long, then it will comprise one entry, and if it is two cycles long, it will comprise two entries. Also by way of example, each transaction from the write unit 21 can be 1 to 8 cycles long, and thus comprise from 1 to 8 entries. For instance, the write unit 21 can be writing back a small chuck of data or a large chunk.

Now suppose according to design rules, the clock cycles are segmented into 4 repetitive units, i.e. A,B,C, and D. Thus, cycle A, is clock cycles 0, 4, 8, 12, and so on. Cycle B is clock cycles 1, 5, 9, 13 and so on. Cycle C is clock cycles 2, 6, 10, 14, and so on. Cycle D is clock cycles 3, 7, 11, 15 and so on. Further suppose, that read unit 22 can start a transaction in cycle A only, thus, the read unit 22 can only begin to load a transaction on cycles 0, 4, 8, etc. If the transaction is one cycle long, then the transaction will occur during cycle A. If it is a two cycle transaction, then the transaction will require cycles A and B. Now as another design rule, suppose the write unit can begin to load a transaction in cycle C only. Thus, if the write unit has a transaction that is one cycle long, it is comprised of cycle C. If the transaction is two cycles long, then it will be comprised of cycles C and D. If the transaction is eight cycles long, then it comprises cycles C, D, A, B, C, D, A, and B. These are arbitrary design rules for illustrative purposes only, and the rules could be different depending on the protocol used by the system.

Now working with the design rules, a write will never conflict with a read operation that is already in progress. Since the read begins on cycle A and can last for up to 2 cycles, and thus will at most end on cycle B, it will never conflict with a write that begins with cycle C. However, since a write transaction can last up to 8 cycles, there is a chance that once a write operation has begun, a later read operation may conflict with the write operation. Specifically if write begins in cycle 2 and will last for 8 cycles, then a conflicting read operation may occur during cycles 4 and 8. To prevent this conflict, write unit will assert the write_in_progress signal 25 to the read unit, which will instruct the read unit not to load any transactions into the FIFO 23. The control logic 26 for the FIFO 23 sends out two signals. One signal a FIFO_full_signal 27 and the other is a FIFO_full_write 28. The FIFO_full_read 27 instructs the read unit 22 that the FIFO 23 is full, and that the read unit 22 should not send any more transactions. The FIFO_full_write 28, similarly instructs the write unit 21 that the FIFO is full, and thus it should send any more transactions. Note that the two signals are different, and this is because each unit has different entry requirements.

For example, suppose the FIFO 23 can hold up to 16 entries. Thus, when the FIFO reaches 9 entries, FIFO_full_write would be asserted, as the next transaction from the write unit 21 may comprise 8 cycles and thus cause an overflow condition. However, since the read unit 22 can only put in a maximum of 2 cycles, then FIFO_full_read would not be asserted until the FIFO reaches 15 entries. Therefore, to pre-vent overflow conditions, the chip must expect the worst case for each future transaction. Note that this assumes a one cycle latency period for each unit. Thus, when one unit loads a new transaction, the controller would see it one cycle later. Similarly, when the control logic 26 issues a FIFO full signal, the particular unit would receive it one cycle later. Also the read unit 22 would receive the write_in_progress signal 25 from the write(unit 21 one cycle later. Note that the control logic 26 could be configured to issue the write_in_progress signal 25 instead of the write unit 21. However, the latency could be more than one cycle and the latency could be different for signals between the different components.

Thus for FIG. 2 the follow design rules are in place:

Read Unit can start to put a transaction in cycles A only.

A transaction may last for one or more consecutive cycles.

Transactions from the Read Unit can be 1 to 2 cycles long.

Write Unite can start to put a transaction in cycle C only.

Transactions from the Write Unit can be 1 to 8 consecutive cycles long.

FIFO holds a maximum of 16 entries.

Write Unit sends a write-in-progress signal to Read Unit if it intends to write the following cycle. Thus, if a write is to start in cycle 2 and continue through cycle 6 (5 cycles long), the write-in-progress gets asserted in cycles 2 through 5.

The control logic for FIFO observes a new entry in the following cycle. Thus, if the Read Unit puts a two cycled transaction in cycles 4 and 5, it sees the first entry of the read transaction in cycle 5 and the second entry in cycle 6.

The Read and Write Units receive the flow control signals FIFO_full_read and FIFO_full-write, respectively. The units do not launch a new transaction when this is asserted. However, a transaction in progress continues.

The control logic's flow-control signals take effect in the following cycle. Thus, FIFO_full_read is meaningful in cycles D only, since it can stop a new transaction from being launched from the Read Unit in cycle A. Similarly, FIFO_full_write is meaningful in cycles B only, since it can potentially stop a new transaction from being issued in cycle C.

The FIFO_full_write signal is designed as follows.

FIFO_full_write=(cycle==B) && (((no_entries prev==7). && (no_entries==8)) ||(no_entries>8))

Thus, this signal would only be asserted in cycle B, since the Write Unit can launch a new transaction only in cycle C. This signal is asserted if the control logic notes an increase in the number of FIFO queue entries from 7 to 8. Thus, it is possible that there may be a new entry being added in cycle B, which could potentially take the number of entries in cycle C to 9. If the Write Unit launched a new transaction in cycle C that is 8 long and if none of the entries unloaded to by consumers (not shown, but note that in FIG. 2, the two producers could also be consumers, with additional paths leading from the queue back to the consumers) in the next 9 cycles, then an overflow condition would exist as the FIFO would have a total of 17 entries. However, if no new entries are being noticed in cycle B, it indicates cycle A was idle. And since no new transactions can be launched in cycle B, then in cycle C, the same number of entries will exist as in cycle B. Therefore, this signal will only be asserted if there are 9 or more entries in the FIFO, since a write transaction of 8 long could overflow. Note that there are other ways of expressing this signal.

The FIFO_full_read signal is designed as follows.

FIFO1—full—read=(cycle==D) && ((no_entries prev==13) && (no_entries==14))||(no_entries>14))

The discussion above with regard to the write unit flow control would apply here, as the equation is the same, but with different numerical values.

Given this design of the FIFO flow-control, a model checking description of the design written in SMV (symbolic model verifier) is as follows. Note that although the following is written in SMV language with CTL (computational tree logic) syntax other languages and syntax could be used.

First, the cyclic nature of clock cycles going from A to D is described.

```
VAR       Cycle:                        {A, B, C, D}
ASSIGN    Init      (Cycle):=           A;
          Next      (Cycle):=           Case
                    (Cycle = A):        B;
                    (Cycle = B):        C;
                    (Cycle = C):        D;
                    (Cycle = D):        A;
          esac
```

Next an abstract model of the read and write units is developed. Note that it is not necessary to model these units in detail since only if and when they can add a new entry to FIFO needs to be modeled.

```
VAR    read_unit_trans_len: {0, 1, 2};
              --transactions from read unit can be 0, 1, or 2 long
ASSIGN
       INIT    (read_unit_trans_len):=     0;
       NEXT    (read_unit_trans_len) :=    case
               (read_unit_trans_len = 2):   1;
               --If we have a 2 cycled long transaction, one
               --cycle would be left the next cycle
               !write_in_progress & !FIFO_full_read
                   &(cycle = D):      {0, 1, 2};
                   --A new transaction may or may not start on
                     the following
                   --cycle A.
               1:0;   --no transaction in the rest of the cases
               esac;
DEFINE READ_UNIT_ADD_FIFO_NEXT:=
               (read_unit_trans_len = 1) | (read_unit_trans_lens = 2);
               --  Adds a new entry to FIFO the following
               --  cycle if it is a '1'
VAR write_unit_trans_len : {0, 1, 2, 3, 4, 5, 6, 7, 8};
ASSIGN init (write_unit_trans_len) : = 0
       next (write_unit_trans_len): = case
                 (write_unit_trans_len > 0):
                       write_unit_trans_len − 1;
                       --transaction in progress case
                 !FIFO_full_write & (cycle = B):
                      {0, 1, 2, 3, 4, 5, 6, 7, 8};
                      --can start a transaction in cycle C if not flow
                      --controlled
                 1:0;    --no transactions for rest
       esac;
DEFINE WRITE_UNIT_ADD_FIFO_NEXT :=
       (write-unit-trans-len > 0);
       --   Adds a new entry to FIFO 1 the next cycle in true
DEFINE write_in_progress:= (write-unit-trans-len > 1);
       --   to indicate to Read Unit that transaction will continue
       --   on to the next cycle
```

Next the number of entries in the FIFO is modeled. This is the valuable no_entries. Note that the control logic sees this value in the next cycle. This is indicated by the variable num_entries_controllogic. The number of entries the control logic noted in the previous cycle also needs to be modeled, via num_entries controllogic_prev.

```
VAR no_entries: {0, 1, 2, 3, . . . 16, 17, 18};
             --   Represents the number of entries with 17 for
                  overflow and
             --   18 for underflow conditions
ASSIGN init (no_entries):= 0;
       next (no_entries): = case
       (READ_UNIT_ADD_FIFO_NEXT |
         WRITE_UNIT_ADD_FIFO_NEXT): case
                  --  the case for adding a new entry
         (no_entries = 16) | (no_entries=17): 17;
                  --  Overflow condition
         (no_entries = 18: 18;
                  --  Underflow has occurred
         (no_entries > 0): {no_entries, no_entries + 1}
                  --  no_entries may remain the same if we unload one
                  --  entry, else it increases.
         1: 1;    --  when no_entries =0, we go to 1
escac;            --  The new entry case
1:case
                  --  no new entry being added, an entry may
                      be taken out
         (no_entries = 0): 0;
         (no_entries = 17): 17;
         (no_entries = 18) 18;
         1: {no_entries no_entries -1};
     esac;
esac;
VAR      num_entries_controllogic: {0, 1, 2, 3, . . . 16, 17, 18};
ASSIGN unit (num_entries_controllogic):= 0;
         next (num_entries_controllogic):= no_entries;
VAR      num_entries_control_logic_prev: {0, 1, 2, . . . 16, 17, 18}
ASSIGN init (num_entries_control_logic_prev):= 0;
         next (num_entries_control_logic_prev): =
           num_entries_control_logic;
```

Next, the flow-control conditions are modeled for the read and write Units.

```
DEFINE FIFO_full_write:=
       (cycle = B) & (
                  ((num_entries_controllogic_prev = 7) &
                     (num_entries_controllogic = 8)
         |
                  (num_entries_controllogic > 8)
       );
DEFINE FIFO_full_read:=
       (cycle = D) & (
                  ((num_entries_controllogic_prev 13) &
                     (num_entries_control_logic = 14))
         |
                  (num_entries_control_logic > 14)
       );
```

This completes the behavioral modeling analysis. The overflow condition can be checked by the following statement.

SPEC AG!(no_entries=17)

This statement has the inventive tool check that in all the states in all possible paths that the number of entries is never 17, i.e., the FIFO never overflows.

Figure 3:
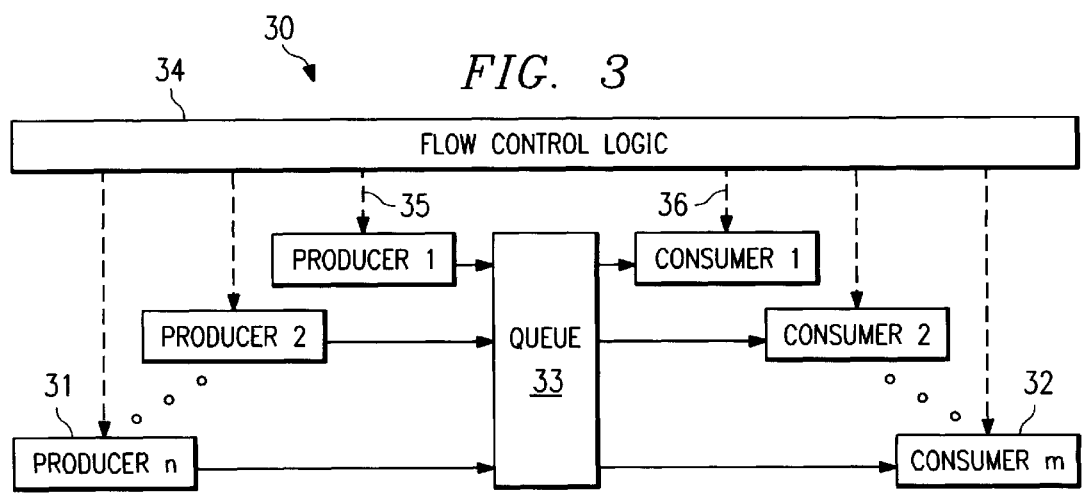
FIG. 3 depicts a queue with n produces and m consumers.

FIG. 3 depicts a more complex version of FIG. 2, showing a larger system 30 having n producers 31 and m consumers 32 which respectively load and unload queue 33. The flow control logic 34 control the different producers and the different consumers, as to when they can load and unload, and when they cannot load and unload. Note that in FIG. 3 the write_in_progress signal 25 is not shown, as here this is sent by the control logic 34. The added complexity in FIG. 3 is from the consumers, which will be looking for a certain number of entries in the queue, and then pulling them out. This is because producers may load at a different rate than consumers unload. Also producers and consumers may act on different cycles. Consequently, the queue must contain an appropriate number of entries on the appropriate cycle for the consumers to unload, else an underflow condition may arise. For example, suppose a producer can load one entry per cycle, while a consumer can unload two entries per cycle. If the queue contains 3 entries when both the producer starts loading and the consumer starts unloading then by the 4th cycle an underflow condition will exist. So the flow control logic must know many entries are there in a queue, figure out how wide or how fast the consumer is going to consume. Note that the consumer must be told ahead of time if it is okay to consume, because once you tell the consumer it is okay to consume, it is going to start consuming at its own pace and there may not be any stopping of it.

Again the inventive tool has three aspects, i.e. modeling the number of entries in the queue, checking for overflow and underflow conditions, and incrementing or decrementing the number of entries on a cycle by cycle basis. The number of entries in the queue of FIG. 3 is modelled by following the flow-control mechanism in a detailed cycle by cycle behavior. If the queue has N entries, the variable no_entries should be defined as follows:

VAR no_entries:{-1, 0, 1, 2, . . . , N, N+1}; where a value -1 indicates the underflow condition and a value N+1 represents the overflow condition. Note the content of the entries does not have to be known, only the number of entries. Moreover, the width of the FIFO does not have to be known. Also note that -2, -3, etc. are not present. Once a -1 is reached, then an underflow condition exists, and it does not matter the extent of the underflow condition (e.g. -5), only that the condition exist. Similarly, N+2, N+3, etc. are not present, because once N+1 is reached, then an overflow condition exists. All the other values represent the number of entries in the queue. Various producers may add to the number of entries in the queue (no_entries), if allowed. Similarly, the consumers may decrement the number of entries in the queue, if allowed. The no_entries entity is adjusted by the number of entries added or removed in each cycle. The flow-control mechanism controls the activities of the producers and the consumers. In order to check that there is no overflow, the following specification is used:

SPEC AG!(no_entries=(N+1)).

This CTL terminology simply asks the model checker to check that the negation of the condition "(no_entries=(N+1))" always holds. In other words, the number of entries in the queue never reaches N+1; the overflow value. This condition must be always globally true.

Similarly, the underflow condition is checked by

SPEC AG!(no_entries=-1) This checks that the number of entries in the queue never reaches -1; the underflow value. If the queue ever underflows, the model checker generates the message and gives an example of underflow. (The same holds for the overflow check.) The designer can then fix the flow-control design, modify the model and run the check again and keep iterating the process till the tool guarantees that there is no overflow or underflow.

The following model checking description is for the system depicted in FIG. 3. Again, note that although the following is written in SMV language with CTL syntax other languages and syntax could be used. Moreover, note that it does not cover all possible configurations in every possible system, and is an example of one such configuration, which demonstrates that queue flow control can be verified by keeping track of the number of entries in the queue and providing the two CTL specifications for the overflow and underflow conditions. The invention can be applied to the verification of any queue in any system, as well as other data storage mechanisms, such as stacks, arrays, RAMs, etc., although the modeling details will depend on the flow-control algorithm and the system parameters. A producer may have some event dependent characteristics that may dictate the number of entries that it can send to the queue. If that event is observed by the flow-control logic to generate the overflow signal, the event needs to be modeled. An example would be a system where a producer may produce an input depending on the clock cycle it is in and the flow-control logic utilizes that information to optimally flow-control each producer individually or flow-control them in groups.

As in FIG. 2, the cycles are segmented into A, B, C, and D. This segmentation prevents a state explosion problem. The state explosion problem is that the more states that are modeled the more bit space is required to represent each state. Thus, the number of states should be kept to a minimum, since there are only four distinct types of cycles, only A–D are required. The different behaviors in cycles A, B, C, D repeat cyclically (A B C D A B . . . ). Assume that the network delay is constant and takes X cycles for a producer's output to enter the queue. Further assume that the flow-control signal from the queue's flow-control logic takes Y cycles to be effective in producer i. And further assume that the flow-control logic has $n_A, n_B, n_C$, and $n_D$ as the high water marks for producer i in cycles A, B, C, and D, respectively. Thus, the SMV description would be as follows:

VAR cycle:{A, B, C, D};
ASSIGN init (cycle):=A;
next (cycle):=case
   cycle=A: B;
   cycle=B: C;
   cycle=C: D;
   cycle=D: A;
esac;

The above statements model the cycles in the system. The outputs of every individual producers needs to be modeled as demonstrated below for producer i. As a comparison, in FIG. 2, it was assumed that in one cycle one entry could loaded or unloaded. The initialization statement is an assumption that at startup nothing will be produced. Thus, at cycle 0, the number of entries that producer i will produce is 0. This assumption may vary from design to design. The remainder of the statements indicate the number of entries that can be produce and loaded into the FIFO in the next cycle, on case by case basis here.

| VAR | producer_i: {0, 1, 2, 3, . . ., max_i }; | --max_i is the maximum number of entries i can produce in one cycle |
|---|---|---|
| ASSIGN | init (producer_i): = 0; next (producer_i): = case    PROD_i_FLOW_CONTROL: 0;    . . . Description of the producer producing different number of entries in each cycle depending on the various events goes here esac; | |

The entity PROD_i_FLOW_CONTROL above represents the scenario where producer i has received the flow-control notice from the queue's flow-control logic after taking the associated delays into account. The notice is SEND_FLOW_CTL_i, but in FIG. 2 it was FIFO_full_write or FIFO_full_read. The notice is again specific to each producer, as well as each particular cycle for each user. Thus, if the particular producer produces only in cycle C, and it is currently cycle D, then the flow control command does not have to be issued for several cycles. In the meantime, a consumer may pull out several entries, thus allowing the producer to produce at the next cycle C. Thus, different cycles have different flow control information. The part of the flow-control logic that requests producer i to stop sending data can be written as:

DEFINE SEND_FLOW_CTL_i:=(cycle == A) & (no_entries > =

$n_A$) I (cycle

== B) & (no_entries >= $n_B$) I (cycle== C) & (no_entries >

= $n_c$) I (cycle== D) & (no_entries > = $n_D$);

It should be noted that the PROD_i_FLOW_CONTROL signal is a Y cycle delayed version of SEND_FLOW_CTL_signal that has to be included in the model to establish a relationship between the two. The SMV description of this delay relationship is similar to the X-cycle delay relationship seen between the number of entries sent by producer i before it can be added to no_entries of the queue. (The SMV description of the former's Y-cycle delay is not presented here to avoid repetition.) Thus, by the time the decision to load to the FIFO arrives, several cycles worth of latency may have passed. And after the transaction has been loaded, the control logic would not have seen it for several cycles. The latency is reconciled with the following statements. Note that what is current in one cycle will be the previous in the next cycle. The X cycle delay can be modeled in the SMV language as follows.

VAR producer_i_1prev: {0, 1, 2, 3 . . . , max_i};
ASSIGN init (producer_i_1prev): = 0;
   next (producer_i_1prev):= producer_i;
VAR producer_i_2prev: {0, 1, 2, 3 . . . , max_i};
ASSIGN init (producer_i_2prev):= 0;
   next (producer_i_2prev):= producer_i_1prev;
.
.
.
VAR producer_i_X_m_1prev: {0, 1, 2, 3 . . . , max_i};
ASSIGN init (producer_i_X_m_1prev):= 0;
   next (producer_i_X_m_1prev):= producer_i_X_m_2prev;
DEFINE ADD_QUEUE_FOR_PROD_I:= producer_i_X_m_1_prev;

It should be noted that model goes to (X−1) cycles, since the Xth cycle will be the entry to the queue. After the delay is compensated for, then each contribution to the queue from each producer is calculated. Note that in FIG. 3 all producers can be producing or loading on the queue at the same time, as opposed to FIG. 2 where only one producer is allowed to produce at one time. Alternatively, the system of FIG. 3 could incorporate a similar signal as in FIG. 2 and only allow one producer to load to the queue at one time. This is performed for each cycle by the control logic. The model will add all such entries that are ready to enter the queue and update the no_entries for the queue according to the value as follows:

---

DEFINE ADD_QUEUE:= ADD_QUEUE_FOR_PROD_0 +
    ADD_QUEUE_FOR_PROD_1 +. . . +
    ADD_QUEUE_FOR_PROD_n;

---

Similarly, the flow-control for the consumers and the removal of entries from the queue can be represented by an expression for SUB_QUEUE.

---

DEFINE SUB_QUEUE = SUB_QUEUE_FOR_CONS_0 +
    SUB_QUEUE_FOR_PROD_1 +. . . +
    SUB_QUEUE_FOR_CONS_M;

---

After SUB_QUEUE has been calculated then the number of entries in the queue can be computed and defined by adding the number of entries removed by all the consumers in the cycle. Initially the number of entries equals 0. The next number of entries equals the current plus any additions to the queue and minus and subtractions from the queue. If the next number of entries is $-1$ or below, then an underflow condition has occurred. If the next number of entries is $N+1$ or above, then an overflow condition has occurred. The number of entries in the queue can be modeled as follows:

---

```
DEFINE no_entries_next:= no_entries + ADD_QUEUE - SUB_QUEUE;
    VAR no_entries:{-1, 0, 1, 2, 3 . . . , N, N +1};
    ASSIGN init (no_entries):= 0;
        next (no_entries):= case
            no_entries_next < 0: -1; --the underflow condition
            no_entries_next > N: N +1 --overflow condition
            1: no_entries_next;
        esac;;
```

---

When this completed model is run with the two specifications described earlier, i.e. overflow and underflow, the accuracy of the flow-control design can be formally verified.

In the following appendix is a SMV model is for an larger and more complex system than depicted in FIGS. 2 and 3. This system has eight cycles, a0 through v1. The a cycles are address cycles, the i cycles are I/O cycles, s cycles are slave address cycles, and v cycles are virtual address cycles. The number of entries, no_rq, can be a maximum of 20, with 21 representing an overflow condition. Note that underflow is not being modeled for in the no_rq section, thus n0_rq=−1 is not defined. The first no_rq section represents a condition where the producers are producing two entries or zero entries and consumers are consuming one entry. Thus where no_rq=0, then no_rq will always go to 2, because a consumer cannot consume because the number of entries is 0. For all the other cases like no_rq=1 or 2, then there is a possibility of incrementing no_rq by 1 or by 2, because 2 entries are being added, it is not known whether a consumer is consuming 1 entry or not. Note that this section is not concerned with the consumer or how the consumer is consuming entries, this considered by having the two possibilities within the parentheses. When no_rq=19, then the possibility of an overflow condition exists, if the consumer does not consume. For all other case, an overflow condition exists.

In the next no_rq section, the producer could be producing 0 or 1 entries, and the consumer can consume 0 or 1 entries. Thus, there are three possibilities in parentheses. Note that it is assumed that when there are 0 entries, the producer always produces 1 entry. In the next no_rq section, the producer is not loading anything, but a consumer could be consuming either 1 or 0 entries. After this no_rq section, the overflow condition is checked. The remainder is the modeling of the flow control logic and system behavior.

---

```
MODULE main
VAR        j_cyc : {a0, a1, i0, i1, s0, s1, v0, v1} -- Represents Jolt cycle
ASSIGN     init(j_cyc) : = a0;
           next(j_cyc) : = case
               j_cyc = a0 : a1;
               j_cyc = a1 : i0;
               j_cyc = i0 : i1;
               j_cyc = i1 : s0;
               j_cyc = s0 : s1;
               j_cyc = s1 : v0;
               j_cyc = v0 : v1;
               j_cyc = v1 : a0;
           esac;
--         Number of entries in RQ.
--         The numbers 0 through 16 represents the number of entries
--         in RQ and 17 represents the overflow case.
--         Here we se one cycle earlier versions of j_cyc, io_st, etc.
--         so that the next(no_rq) is taken care of -- it appears 1 cycle later.
VAR        no_rq :{0, 1, 2, 3, 4, 5, 6, 7, 8, 9, 10, 11, 12, 13, 14, 15, 16, 17, 18, 19, 20 21};
ASSIGN     init(no_rq) : = 0;
           next(no_req: : = case
                                -- io_st in v0 is checked first increases RQ by 2.
                                -- A possible decrease in RQ value is also modeled.
               (j_cyc = s1) & io_st_1 & !FRZ_NEXT: case
                   no_rq = 0 : 2; -- assume can not unload immediately
                   no_rq = 1 : {2,3};
                   no_rq = 2 : {3,4};
                   no_rq = 3 : {4,5};
                   no_rq = 4 : {5,6};
                   no_rq = 5 : {6,7};
                   no_rq = 6 : {7,8};
```

```
                    no_rq = 7 : {8,9};
                    no_rq = 8 : {9,10};
                    no_rq = 9 : {10,11};
                    no_rq = 10 : {11,12};
                    no_rq = 11 : {12,13};
                    no_rq = 12 : {13,14};
                    no_rq = 13 : {14,15};
                    no_rq = 14 : {15,16};
                    no_rq = 15 : {16,17};
                    no_rq = 16 : {17,18};
                    no_rq = 17 : {18,19};
                    no_rq = 18 : {19,20};
                    no_rq = 19 : {20,21};
                    1 : 21;
            esac;
                    -- Rest of the cases. An increase is possible due
                    -- to a request from summit or async logic (not both)
                    -- along with a possible decrease due to runway trans.
(j_cyc = v1 |j_cyc = a0 |j_cyc = a1 |j_cyc = i1 |
(j_cyc = s1) & !i0_st_1)) & !FRZ_NEXT) |
(!NO_ASYN_REQ): case
            no_rq = 0 : 1; -- assume can not unload immediately
            no_rq = 1 : {0,1,2};
            no_rq = 2 : {1,2,3};
            no_rq = 3 : {2,3,4};
            no_rq = 4 : {3,4,5};
            no_rq = 5 : {4,5,6};
            no_rq = 6 : {5,6,7};
            no_rq = 7 : {6,7,8};
            no_rq = 8 : {7,8,9};
            no_rq = 9 : {8,9,10};
            no_rq = 10 : {9,10,11};
            no_rq = 11 : {10,11,12};
            no_rq = 12 : {11,12,13};
            no_rq = 13 : {12,13,14};
            no_rq = 14 : {13,14,15};
            no_rq = 15 : {14,15,16};
            no_rq = 16 : {15,16,17};
            no_rq = 17 : {16,17,18};
            no_rq = 18 : {17,18,19};
            no_rq = 19 : {18,19,20};
            no_rq = 20 : {19,20,21};
            1 : 21;
        esac;
        1 : case    -- decrease by 1 possible due to RQ unloading.
            no_rq = 0 : 0;
            no_rq = 1 : {0,1};
            no_rq = 2 : {1,2};
            no_rq = 3 : {2,3};
            no_rq = 4 : {3,4};
            no_rq = 5 : {4,5};
            no_rq = 6 : {5,6};
            no_rq = 7 : {6,7};
            no_rq = 8 : {7,8};
            no_rq = 9 : {8,9};
            no_rq = 10 : {9,10};
            no_rq = 11 : {10,11};
            no_rq = 12 : {11,12};
            no_rq = 13 : {12,13};
            no_rq = 14 : {13,14};
            no_rq = 15 : {14,15};
            no_rq = 16 : {15,16};
            no_rq = 17 : {16,17};
            no_rq = 18 : {17,18};
            no_rq = 19 : {18,19};
            no_rq = 20 : {19,20};
            1 : 21;
        esac;
    esac;
SPEC AG !(no_rq = 21) -- Check we do not overflow anytime.
-- rq_early_cnt is a one cycle delayed version of the number of
-- entries in the runway queue - it is RQ_early_cnt.
VAR     rq_early_cnt :{0, 1, 2, 3, 4, 5, 6, 7, 8, 9, 10, 11, 12, 13, 14, 15, 16, 17, 18, 19, 20, 21};
        -- One cycle delayed version of number of entries in RQ
ASSIGN  init(rq_early_cnt) : = 0;
        next(rq_early_cnt) : = no_rq;
VAR     no_rq_2prev :{0, 1, 2, 3, 4, 5, 6, 7, 8, 9, 10, 11, 12, 13, 14, 15, 16, 17, 18, 19, 20, 21};
        -- Two cycle delayed version of number of entries in RQ
ASSIGN  init(no_rq_2prev) : = 0;
        next(no_rq_2prev) : = rq_early_cnt;
```

```
-continued

VAR       rq_late_cnt : {0, 1, 2, 3, 4, 5, 6, 7, 8, 9, 10, 11, 12, 13, 14, 15, 16, 17, 18, 19, 20, 21};
          -- Three cycle delayed version of no of entries in RQ : RA_late_cnt
ASSIGN    init(rq_late_cnt) : = 0;
          next(rq_late_cnt_: = no_rq_2prev;
DEFINE    RQ_LC_GE_13 : = (rq_late_cnt = 13) |(rq_late_cnt = 12) |(rq_late_cnt = 11) |
(rq_late_cnt = 10) |
          (rq_late_cnt = 9) |(rq_late_cnt = 10) |(rq_late_cnt = 11) |(rq_late_cnt = 12) |
(rq_late_cnt = 13) |
          (rq_late_cnt = 14) |(rq_late_cnt = 15) |(rq_late_cnt = 16) |(rq_late_cnt = 17) |
(r_late_cnt = 18) |
          (rq_late_cnt = 14) |(rq_late_cnt = 19) |(rq_late_cnt = 20) |(rq_late_cnt = 21);
          -- Denotes RQ_late_cnt > = 10
DEFINE    RQ_LC_GE_12 : = (rq_late_cnt = 12) |RQ_LC_GE_13;
DEFINE    RQ_LC_GE_11 : = (rq_late_cnt = 11) |RQ_LC_GE_12;
DEFINE    RQ_LC_GE_10 : = (rq_late_cnt = 10) |RQ_LC_GE_11;
DEFINE    RQ_LC_GE_9 : = (rq_late_cnt = 9) |RQ_LC_GE_10;
DEFINE    RQ_LC_GE_8 : = (rq_late_cnt = 8) |RQ_LC_GE_9;
DEFINE    RQ_LC_GE_7 : = (rq_late_cnt = 7) |RQ_LC_GE_8;
DEFINE    RQ_LC_GE_6 : = (rq_late_cnt = 6) |RQ_LC_GE_7;
DEFINE    NO_ASYN_REQ : = (no_rq = 9) |(no_rq = 10) |(no_rq = 11) |(no_rq = 12)
(no_rq = 13)
          (no_rq = 14) |(no_rq = 15) |(no_rq = 16) |(no_rq = 17) |(no_rq = 18) |(no_rq
= 19)
          (no_rq = 20) |(no_rq = 21);
          Represents no_async_rqst.
DEFINE    A1_WAIT : = (j_cyc = a1) & ((RQ_LC_GE_11 & IO_ST_1) |RQ_LC_GE_12);
DEFINE    I1_WAIT : = (j_cyc = i1) & ((RQ_LC_GE_10 & IO_ST_1 & IO_ST_2) |
(RQ_LC_GE_11 & (IO_ST_1 |IO_ST_2)) |
          RQ_LC_GE_12);
DEFINE    S1_WAIT : = (j_cyc = s1) & ((RQ_LC_GE_11 & IO_ST_1 & IO_ST_2) |
(RQ_LC_GE_12 & (IO_ST_1 |I0_ST_2)) |
          RQ_LC_GE_13);
DEFINE    V1_WAIT : = (j_cyc = v1) & ((RQ_LC_GE_10 & IO_ST_1 & IO_ST_2) |
(RQ_LC_GE_11 & (IO_ST_1 |IO_ST_2)) |
          RQ_LC_GE_12);
DEFINE    WAIT_REQ_n_m_5 : = A1_WAIT |I1_WAIT |S1_WAIT |V1_WAIT; -- Indicates
          -- wait request logic putting the request - shows
          -- up in summit 5 j_cycles later.
VAR       wait_req_n_m_4 : boolean; -- One cycle delayed version of
                                    -- wait request logic. 4 cycles to summit.
ASSIGN    init(wait_req_n_m_4) : = 0;
          next(wait_req_n_m_4) " = WAIT_REQ_n_m_5;
VAR       wait_req_n_m_3 : boolean; -- Two cycle delayed version of
                                    -- wait request logic. 3 cycles to summit.
ASSIGN    init(wait_req_n_m_3) : = 0;
          next(wait_req_n_m_3) : = wait_req_n_m_4;
VAR       wait_req_n_m_2 : boolean; -- Three cycle delayed version of
                                    -- wait request logic. 2 cycles to summit.
ASSIGN    init(wait_req_n_m_2) : = 0;
          next(wait_req_n_m_2) wait_req_n_m_3;
VAR       wait_req_n_m_1 : boolean; -- For cycle delayed version of
                                    -- wait request logic. 1 cycle to summit.
ASSIGN    init(wait_req_n_m_1) : = 0;
          next(wait_req_n_m_1) : = wait_req_n_m_2;
VAR       wait_req_n : boolean: -- wait request in present cycle in
                                -- summit, 5 cycles after the request made.
ASSIGN    init(wait_req_n) : = 0;
          next(wait_req_n) : = case
              wait_req_n_p_1 |wait_req_n_p_3 |wait_req_n_p_5 : 0;
                  -- Discard any wait requests if there was a
                  -- wait request in any of the previous three
                  -- summit cycles.
              (j_cyc = a1) |(j_cyc = i1) |(j_cyc = s1) |(j_cyc = v1) : {wait_req_n_m_1, 1};
                  -- Non-deterministic 1 for other Jolts
              1 : 0;
          esac;
--SPEC    AF wait_req_n
--SPEC    AG AF !wait_req_n
VAR       wait_req_n_p_1 : boolean; -- One cycle after wait asserted.
ASSIGN    init(wait_req_n_p_1) : = 0;
          next(wait_req_n_p_1) : = wait_req_n;
VAR       wait_req_n_p_2 : boolean;
ASSIGN    init(wait_req_n_p_2) : = 0;
          next(wait_req_n_p_2) : = wait_req_n_p_1;
VAR       wait_req_n_p_3 : boolean;
ASSIGN    init(wait_req_n_p_3) : = 0;
          next(wait_req_n_p_3) : = wait_req_n_p_2;
VAR       wait_req_n_p_4 : boolean;
ASSIGN    init(wait_req_n_p_4) : = 0;
          next(wait_req_n_p_4) : = wait_req_n_p_3;
```

-continued

```
VAR        wait_req_n_p_5 : boolean;
ASSIGN     init(wait_req_n_p_5) : = 0;
           next(wait_req_n_p_5) : = wait_req_n_p_4;
VAR        wait_req_n_p_6 : boolean;
ASSIGN     init(wait_req_n_p_6) : = 0;
           next(wait_req_n_p_6) : = wait_req_n_p_5;
VAR        wait_req_n_p_7 : boolean;
ASSIGN     init(wait_req_n_p_7) : = 0;
           next(wait_req_n_p_7) : = wait_req_n_p_6;
VAR        wait_req_n_p_8 : boolean;
ASSIGN     init(wait_req_n_p_8) : = 0;
           next(wait_req_n_p_8) : = wait_req_n_p_7;
VAR        wait_req_n_p_9 : boolean;
ASSIGN     init(wait_req_n_p_9) : = 0;
           next(wait_req_n_p_9) : = wait req_n_p_8;
VAR        wait_req_n_p_10 : boolean;
ASSIGN     init(wait_req_n_p_10) : = 0;
           next(wait_req_n_p_10) : = wait_req_n_p_9;
VAR        wait_req_n_p_11 : boolean;
ASSIGN     init(wait_req_n_p_11) : = 0;
           next(wait_req_n_11) : = wait_req_n_p_10;
--VAR      wait_req_n_p_12 : boolean;
--ASSIGN   init(wait_n_p_12) : = 0;
           next(wait_req_n_p_12) : = wait_req_n_p_11;
--DEFINE   FRZ_NEXT : = wait_req_n_p_5 |wait_req_n_p_6 |wait_req_n_p_7 |
wait_req_n_p_8 |wait_req_n_p_9 |
           wait_req_n_p_10 |wait_req_n_p_11 |wait_req_n_p_12;
DEFINE     FRZ_NEXT : = wait_req_n_p_4 |wait_req_n_p_5 |wait_req_n_p_6 |
wait_req_n_7 |wait_req_n_p_8 |
           wait_req_n_p_9 |wait_req_n_p_10 |wait_req_n_p_11;
           -- FRZ will show up next cycle. Needed to freeze the
           -- transitions in io_st states so that they do not move.
VAR        io_st_ask : boolean; -- 13 Cycles later io_st will enter
                   -- RQ in j_cycle v0.
ASSIGN     init(io_st_ask) : = 0;
           next(io_st_ask) : = case
                   FRZ_NEXT : io_st_ask;
                   (j_cyc = a0) : {}, 1};
                   1 : 0;
           esac;
VAR        io_st_12 : boolean; -- 12 cycles later io_st enters RQ w/o freeze
ASSIGN     init(io_st_12) := 0;
           next(io_st_12) : = (FRZ_NEXT & io_st_12) |(!FRZ_NEXT & io_st_ask);
VAR        io_st_11 : boolean; -- 11 cycles later io_st_will enter RQ if
                   -- no freeze comes in.
ASSIGN     init(io_st_11) : = 0;
           next(io_st_11) := (FRZ_NEXT & io_st_11) |(!FRZ_NEXT & io_st_12);
VAR        io_st_10 : boolean; -- 10 cycles later io_st will enter RQ
ASSIGN     init(io_st_10) : = 0;
           next(io_st_10) : = (FRZ_NEXT & io_st_10) |(!FRZ_NEXT & io_st_11);
VAR        io_st_9 : boolean; -- 9 cycles later io_st will enter RQ
ASSIGN     init(io_st_9) : = 0;
           next(io_st_9) : = (FRZ_NEXT & io_st_9) |(!FRZ_NEXT & io_st_10);
VAR        io_st_8 boolean; -- 8 cycles later io_st will enter RQ
ASSIGN     init(io_st_8) : = 0;
           next(io_st_8) : = (FRZ_NEXT & io_st_8) |(!FRZ_NEXT & io_t_9);
VAR        io_st_7 : boolean; -- 7 cycles later io_st will enter RQ
ASSIGN     init(io_st_7) : = 0;
           next(io_st_7) : = (FRZ_NEXT & io_st_7) |(!FRZ_NEXT & io_st_8);
VAR        io_st_6 : boolean; -- 6 cycles later io_st will enter RQ
ASSIGN     init(io_st_6) : = 0;
           next(io_st_6) := (FRZ_NEXT & io_st_6) |(!FRZ_NEXT & io_st_7);
VAR        io_st_5 : boolean; -- 5 cycles later io_st will enter RQ
ASSIGN     init(io_st_5) : = 0;
           next(io_st_5) : = (FRZ_NEXT & io_st_5) |(!FRZ_NEXT & io_st_6);
VAR        io_st_4 : boolean; -- 4 cycles later io_st will enter RQ
ASSIGN     init(io_st_4) : = 0;
           next(io_st_4) : = (FRZ_NEXT & io_st_4) |(!FRZ_NEXT & io_st_5);
VAR        io_st_3 : boolean; -- 3 cycles later io_st will enter RQ
ASSIGN     init(io_st_3) : = 0;
           next(io_st_3) : = (FRZ_NEXT & io_st_3) |(!FRZ_NEXT & io_st_4);
VAR        io_st_2 : boolean; --2 cycles later io_st will enter RQ
ASSIGN     init(io_st_2) : = 0;
           next(io_st_2) : = (FRZ_NEXT & io_st_2) |(!FRZ_NEXT & io_st_3);
VAR        io_st_1 : boolean; -- 1 cycles later io_st will enter RQ
ASSIGN     init(io_st_1) : = 0;
           next(io_st_1) : = (FRZ_NEXT & io_st_1) |(!FRZ_NEXT & io_st_2);
VAR        io_st_now : boolean; -- io_st enters RQ
ASSIGN     init(io_st_now) : = 0;
           next(io_st_now) : = (FRZ_NEXT & io_st_now) |(!FRZ_NEXT & io_st_1);
```

-continued

```
VAR      io_st_past_1 : boolean; -- io_st entered RQ previous cycle.
ASSIGN   init(io_st_past_1) : = 0;
         next(io_st_past_1) : = (FZ_NEXT & io_st_past_1) |(!FRZ_NEXT & io_st_now);
VAR      io_st_past_2 : boolean; -- io_st entered RQ 2 cycles back.
ASSIGN   init(io_st_past_2) : = 0;
         next(io_st_past_2) : = (FRZ_NEXT & io_st_past_2) |(!FRZ_NEXT & io_st_past_1);
DEFINE   IO_ST_1 : = io_st_5 |io_st_4 |io_st_3 |io_st_2 |io_st_1 |io_st_now |io_st_past_1
|io_st_past_2;
DEFINE   IO_ST_2 : = io_st_ask |io_st_12 |io_st_11 |io_st_10 |io_st_9 |io_st_8 |io_st_7 |
io_st_6;
```

Although the present invention and its advantages have been described in detail, it should be understood that various changes, substitutions and alterations can be made herein without departing from the spirit and scope of the invention as defined by the appended claims.

What is claimed is:

1. A method for verifying flow control of a queue through a plurality of situations on a cycle by cycle basis, the method comprising the steps of:
   (a) modeling the queue;
   (b) checking for an overflow condition and an underflow condition in the model during a cycle;
   (c) determining a change to a number of entries in the queue during the cycle;
   (d) adjusting the model based upon the determination of step (c); and
   (e) repeating the steps (b), (c), and (d) until each situation of the plurality of situations has been verified.

2. The method of claim 1, wherein step (a) comprise the step of:
   modeling the number of entries in the queue.

3. The method of claim 2, wherein the queue is modeled to have a number of entries in a range of −1 to N+1,
   where N is a maximum number of entries the queue may hold, −1 represents the underflow condition, and N+1 represents the overflow condition.

4. The method of claim 1, wherein step (a) further comprises the step of:
   segmenting the situations into a plurality of repeating cycles;
   wherein the queue behaves similarly within in each of the segmented cycles.

5. The method of claim 4, wherein at least one producer device adds at least one entry into the queue and at least one consumer device removes at least one entry from the queue, and step (a) further comprises the steps of:
   modeling a number of entries that the one producer is capable of adding to the queue in each segmented cycle; and
   modeling a number of entries that the one consumer is capable of removing from the queue in each segmented cycle.

6. The method of claim 5, wherein there are a plurality of producer devices and a plurality of consumer devices, and an amount that each of the producers and consumers is capable of respectively adding to and removing from the queue in each segmented cycle is modeled.

7. The method of claim 5, wherein step (a) further comprises the step of:
   modeling flow control logic of the queue which determines whether each of the one consumer and the one producer will be granted access to the queue during each segmented cycle based upon the number of entries in the queue in each segmented cycle.

8. The method of claim 7, wherein the step of modeling flow control logic comprises the steps of:
   comparing a threshold value to the number of entries;
   determining, based on an outcome of the step of comparing, whether each of the one producer and the one consumer will be granted access to the queue; and
   repeating the steps of comparing and determining for each segmented cycle.

9. The method of claim 8, wherein the threshold value is different for the one producer and the one consumer.

10. The method of claim 9, wherein there are a plurality of producer devices and a plurality of consumer devices, and the threshold value capable of being different for each of the producers and consumers.

11. The method of claim 8, wherein the threshold value varies for each segmented cycle.

12. The method of claim 1, wherein step (a) comprises the step of:
    modeling the delay characteristics of the queue and each producer device and consumer device associated with the queue.

13. A system for verifying flow control of a queue through a plurality of situations on a cycle by cycle basis, the system comprising:
    means for modeling the queue;
    means for checking for an overflow condition and an underflow condition in the model during a cycle;
    means for determining a change to a number of entries in the queue during the cycle; and
    means for adjusting the model based upon the determinated change;
    wherein the means for checking, determining and adjusting operate until each situation of the plurality of situations has been verified.

14. The system of claim 13, wherein:
    the means for modeling the queue models the number of entries in the queue.

15. The system of claim 14, wherein the queue is modeled to have a number of entries in a range of −1 to N+1,
    where N is a maximum number of entries the queue may hold, −1 represents the underflow condition, and N+1 represents the overflow condition.

16. The system of claim 13, wherein the means for modeling the queue comprises:
    means for segmenting the situations into a plurality of repeating cycles;
    wherein the queue behaves similarly within in each of the segmented cycles.

17. The system of claim 16, wherein at least one producer device adds at least one entry into the queue and at least one consumer device removes at least one entry from the queue, and the means for modeling further comprises:
    means for modeling an amount of entries that the one producer is capable of adding to the queue in each segmented cycle; and means for modeling an amount of entries that the one consumer is capable of removing from the queue in each segmented cycle.

18. The system of claim 17, wherein there are a plurality of producer devices and a plurality of consumer devices, and a number of entries that each of the producers and consumers is capable of respectively adding to and removing from the queue in each segmented cycle is modeled.

19. The system of claim 17, wherein the means for modeling further comprises:

means for modeling flow control logic of the queue which determines whether each of the one consumer and the one producer will be granted access to the queue during each segmented cycle based upon the number of entries in the queue in each segmented cycle.

20. The system of claim 19, wherein the means for modeling flow control logic comprises:

means for comparing a threshold value to the number of entries; and means for determining, based on an outcome of the step, of comparing, whether each of the one producer and the one consumer will be granted access to the queue;

wherein the means for comparing and means for determining operate for each segmented cycle.

21. The system of claim 20, wherein the threshold value is different for the one producer and the one consumer.

22. The system of claim 21, wherein there are a plurality of producer devices and a plurality of consumer devices, and the threshold value capable of being different for each of the producers and consumers.

23. The system of claim 20, wherein the threshold value varies for each segmented cycle.

24. The system of claim 13, further comprising:

means for modeling the delay characteristics of the queue and each producer device and consumer device associated with the queue.

25. A computer program product having a computer readable medium having computer program logic recorded thereon for verifying flow control of a queue through a plurality of situations on a cycle by cycle basis, the computer program product comprising:

means for modeling the queue;

means for checking for an overflow condition and an underflow condition in the model during a cycle;

means for determining a change to a number of entries in the queue during the cycle; and means for adjusting the model based upon the determinated change;

wherein the means for checking, determining and adjusting operate until each situation of the plurality of situations has been verified.

26. The computer program product of claim 25, wherein:

the means for modeling the queue models the number of entries in the queue.

27. The computer program product of claim 26, wherein the queue is modeled to have a number of entries in a range of −1 to N+1, where N is a maximum number of entries the queue may hold, −1 represents the underflow condition, and N+1 represents the overflow condition.

28. The computer program product of claim 25, wherein the means for modeling the queue comprises:

means for segmenting the situations into a plurality of repeating cycles;

wherein the queue behaves similarly within in each of the segmented cycles.

29. The computer program product of claim 28, wherein at least one producer device adds at least one entry into the queue and at least one consumer device removes at least one entry from the queue, and the means for modeling further comprises:

means for modeling an amount of entries that the one producer is capable of adding to the queue in each segmented cycle; and means for modeling an amount of entries that the one consumer is capable of removing from the queue in each segmented cycle.

30. The computer program product of claim 29, wherein there are a plurality of producer devices and a plurality of consumer devices, and a number of entries that each of the producers and consumers is capable of respectively adding to and removing from the queue in each segmented cycle is modeled.

31. The computer program product of claim 29, wherein the means for modeling further comprises:

means for modeling flow control logic of the queue which determines whether each of the one consumer and the one producer will be granted access to the queue during each segmented cycle based upon the number of entries in the queue in each segmented cycle.

32. The computer program product of claim 31, wherein the means for modeling flow control logic comprises:

means for comparing a threshold value to the number of entries; and means for determining, based on an outcome of the step of comparing, whether each of the one producer and the one consumer will be granted access to the queue;

wherein the means for comparing and means for determining operate for each segmented cycle.

33. The computer program product of claim 32, wherein the threshold value is different for the one producer and the one consumer.

34. The computer program product of claim 33, wherein there are a plurality of producer devices and a plurality of consumer devices, and the threshold value capable of being different for each of the producers and consumers.

35. The computer program product of claim 32, wherein the threshold value varies for each segmented cycle.

36. The computer program product of claim 25, further comprising:

means for modeling the delay characteristics of the queue and each producer device and consumer device associated with the queue.

\* \* \* \* \*